(12) United States Patent
Whitted

(10) Patent No.: US 6,845,009 B1
(45) Date of Patent: Jan. 18, 2005

(54) COOLING BAFFLE AND FAN MOUNT APPARATUS

(75) Inventor: William H. Whitted, Palo Alto, CA (US)

(73) Assignee: Google Inc., Mountain View, CA (US)

(*) Notice: Subject to any disclaimer, the term of this patent is extended or adjusted under 35 U.S.C. 154(b) by 0 days.

(21) Appl. No.: 10/676,840

(22) Filed: Sep. 30, 2003

(51) Int. Cl.$^7$ ................................................ H05K 7/20
(52) U.S. Cl. .................. 361/695; 361/690; 361/719; 174/16.1; 454/184
(58) Field of Search ..................... 361/683–688, 361/690, 694, 695, 715–721; 174/16.1, 16.3; 165/80.2, 80.3; 454/184

(56) References Cited

U.S. PATENT DOCUMENTS

| | | | | |
|---|---|---|---|---|
| 6,031,717 A | * | 2/2000 | Baddour et al. | 361/687 |
| 6,317,320 B1 | * | 11/2001 | Cosley et al. | 361/695 |
| 6,478,284 B2 | * | 11/2002 | Qiu | 248/680 |
| 6,504,718 B2 | * | 1/2003 | Wu | 361/395 |
| 6,592,449 B2 | * | 7/2003 | Cipolla et al. | 454/184 |
| 6,700,778 B1 | * | 3/2004 | Wang | 361/690 |
| 6,785,145 B1 | * | 8/2004 | Wong | 361/752 |
| 2004/0162018 A1 | * | 8/2004 | Lee et al. | 454/184 |

* cited by examiner

*Primary Examiner*—Boris Chervinsky
(74) *Attorney, Agent, or Firm*—Jung-hua Kuo (57) ABSTRACT

A cooling baffle and fan mount apparatus suitable for rack mount computing systems is disclosed. The apparatus generally includes an upper and lower bracket configured to receive fans therebetween, the lower bracket defining mounting openings to cooperate with base openings defined in an electronics components base, and a baffle portion extending between the upper and lower brackets and defining fan openings to cooperate with the fans for airflow to pass through the baffle portion via the openings. The mounting openings may be configured for a flexible securing material, e.g., a hook and loop material, to extend therethrough from the base openings. A hook and loop tab may be secured to an underside of the upper bracket to cooperate with the hook and loop material to further secure the baffle. Each fan may provide a recessed region between two plates to receive the hook and loop material and to allow the hook and loop material to be wrapped around the fan and secured to itself.

20 Claims, 2 Drawing Sheets

COOLING BAFFLE AND FAN MOUNT APPARATUS

BACKGROUND OF THE INVENTION

1. Field of the Invention

The present invention relates generally to rack mount computer systems. More specifically, a cooling baffle and fan mount apparatus suitable for rack mount computing systems is disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

When an electronics component on a particular electronics tray is to be serviced or replaced, a service technician would typically remove the particular electronics tray from the server rack and then remove the electronics component from the electronics tray. However, in order to even gain access to the desired electronics component, drive cooling baffles may need to be removed. Drive cooling baffles are sometimes used to help direct the air flow around the electronics components that need to be cooled by fans.

The baffles may be mounted to the electronics tray via screws engaged with threaded mounting holes provided in the electronics component and/or the electronics tray. The service personnel must first remove the mounting screws for the baffle before access is gained to the desired electronics component. However, in many electronics trays, the electronics components are mounted side-by-side in close proximity with other electronics components such that access to the mounting screws for the baffle may be blocked. Because access to the baffle mounting screws may be awkward and difficult, removing or reinstalling the mounting screws and baffle is often a difficult task. Further, the removal or reinstallation process would also require the use of tools, making the servicing or replacing of an electronics component a more difficult, labor intensive, and time consuming process. The result is increased server downtime and increased cost resulting from both the server down time and increased labor costs associated with the service technician.

Thus, it would be desirable to provide a cooling baffle that effectively cooperates with a fan to direct air flow and that provides fast and convenient installation and/or removal onto or out of a computer such as an electronics tray of a rack mount computing system.

SUMMARY OF THE INVENTION

A cooling baffle and fan mount apparatus suitable for rack mount computing systems is disclosed. It should be appreciated that the present invention can be implemented in numerous ways, including as a process, an apparatus, a system, a device, or a method. Several inventive embodiments of the present invention are described below.

According to one embodiment, the cooling baffle and fan mount apparatus generally includes an upper and lower bracket configured to receive fans therebetween, the lower bracket defining mounting openings to cooperate with base openings defined in an electronics components base, and a baffle portion extending between the upper and lower brackets and defining fan openings to cooperate with the fans for airflow to pass through the baffle portion via the openings. The mounting openings may be configured for a flexible securing material, e.g., a hook and loop material, to extend therethrough from the base openings. A hook and loop tab may be secured to an underside of the upper bracket to cooperate with the hook and loop material to further secure the fan. Each fan may provide a recessed region between two plates to receive the hook and loop material and to allow the hook and loop material to be wrapped around the fan and secured to itself.

According to another embodiment, a cooling system generally includes fans, a baffle for mounting the fans therein and a flexible securing material for each fan configured to wrap around a perimeter of the fan to secure the corresponding fan to the baffle. The baffle generally includes an upper bracket, a lower bracket and a baffle portion extending between the upper and lower brackets, the upper and lower brackets being configured to receive the fans therebetween, the baffle portion defining fan openings each corresponding to and to cooperate with one of the fans for airflow to pass through the baffle portion via the fan opening, the baffle being configured to be secured to a mounting base to which electronics components are attached.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

A cooling baffle and fan mount apparatus suitable for rack mount computing systems is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
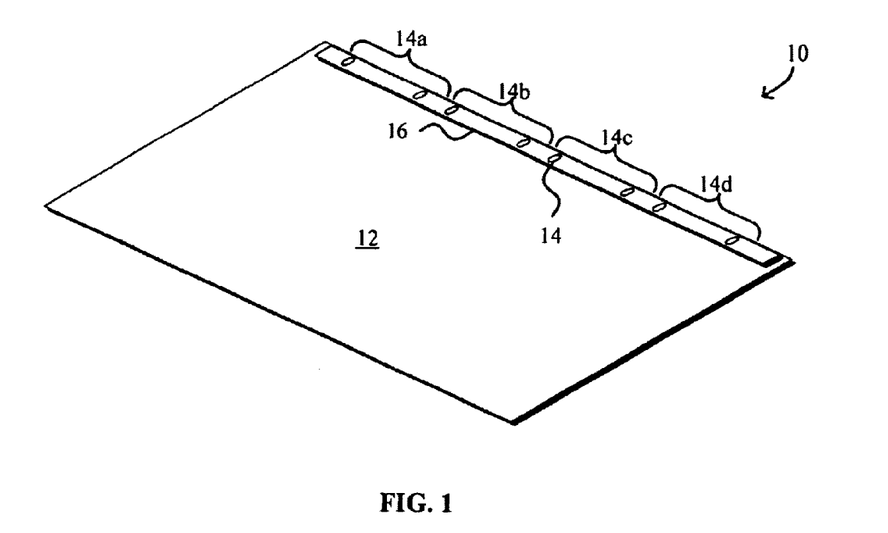
FIG. 1 is a perspective view of an illustrative electronics module configured for a fan mount baffle and suitable for use and placement in a rack mount computing system.

FIG. 1 is a perspective view of an illustrative electronics module 10 configured for a fan mount baffle (not shown) and suitable for use and placement in a rack mount computing system (also not shown). The electronics module 10 includes a base, platform, shelf or tray 12 onto which various electronics components (not shown) may be mounted. The electronics module base 12 is configured for a cooling baffle and fan mount apparatus (not shown) to provide a mounting mechanism for at least one cooling fan and to provide a baffle for the fan(s) in order to provide cooling to the electronics components. In particular, the electronics module base 12 defines baffle mounting openings 14 configured to cooperate with corresponding openings of the cooling baffle and fan mount apparatus (also referred to herein as a fan mount baffle) as will be described in more detail below. The openings are optionally configured in pairs with each pair corresponding to each fan to be mounted to the fan mount baffle. For example, four pairs of baffle mounting openings 14a, 14b, 14c, 14d are shown in FIG. 1 to correspond to four pairs of openings defined in the fan mount baffle and to the four fans to be mounted to the fan mount baffle. However, any suitable number of pairs of baffle mounting openings may be provided.

The electronics module base 12 preferably also provides a baffle mounting projection or protuberance 16. The baffle mounting projection 16 may be formed integrally within the electronics module base 12 or may be formed separately from and attached to the electronics module base 12. As shown, the baffle mounting projection 16 as well as the baffle mounting openings 14 may generally extend approximately an entire width of the electronics module base 12. However, any suitable number of fans and any suitable length of fan mounting baffle and/or baffle mounting projection 16 may be employed. The baffle mounting projection 16 allows a flexible securing material (not shown) to be approximately flush with a bottom surface of the electronics module base 12 as will be described in more detail below.

Figure 2:
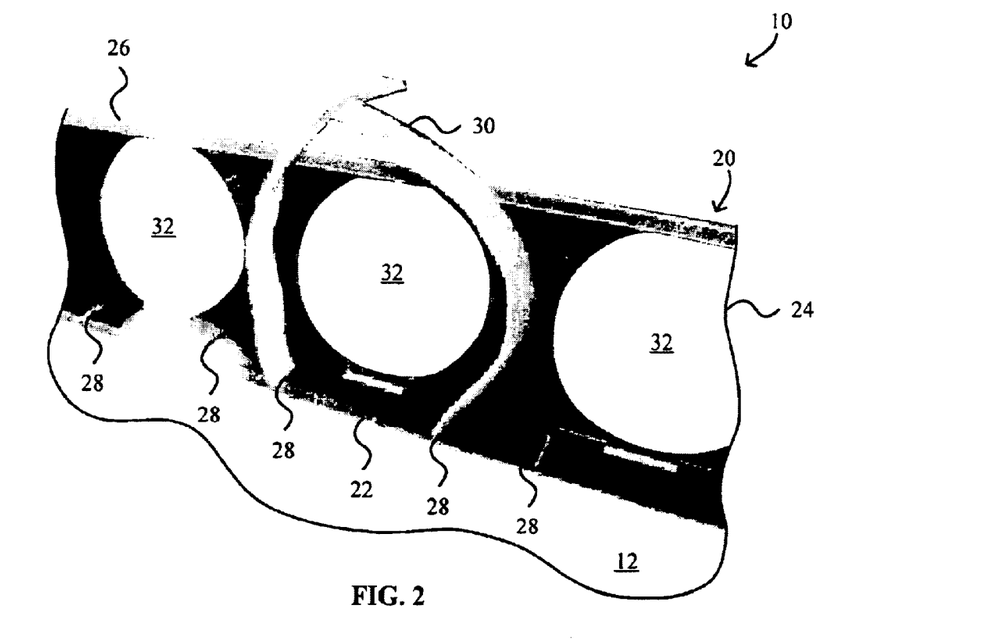
FIG. 2 is a partial perspective view of a the fan mount baffle positioned for mounting to the electronics module base of the electronics module via a flexible securing material.

FIG. 2 is a partial perspective view of the fan mount baffle 20 positioned for mounting to the electronics module base 12 of the electronics module 10 via a flexible securing material 30. The flexible securing material 30 may be a hook and loop material such as a Velcro strap, or any other suitable material that preferably can be repeatedly secured and unsecured. As shown, the fan mount baffle 20 may generally include a lower bracket 22, an upper bracket 26 and a baffle portion 24 extending between the lower and upper brackets 22, 26. The lower bracket 22 may optionally define an indentation on its underside to cooperate with the baffle mounting projection 16 of the electronics module base 12. In other words, the indentation defined in the lower bracket 22 of the fan mount baffle 20 would be positioned over the baffle mounting projection 16 of the electronics module base 12 (shown in FIG. 1).

The fan mount baffle 20 is also positioned over the electronics module base 12 such that at least some of the mounting openings 28 defined by the lower bracket 22 are aligned with at least some of the baffle mounting openings 14 defined in the electronics module base 12. For each fan to be mounted, a pair of the openings 14 of the base 12 are aligned with a corresponding pair of openings 28 of the baffle 20. The aligned pairs of the baffle mounting openings 14 of the base 12 and the mounting openings 28 of the baffle 20 thus facilitate extending the flexible securing material 30 therethrough. Specifically, the flexible securing material 30 preferably spans between the aligned pair of the openings 14, 28 under the base 12 and extends through the pair of the openings 14, 28 to above the base 12. A separate piece of the flexible securing material 30 is preferably provided for each fan.

As noted above, the baffle mounting projection 16 of the base 12 (shown in FIG. 1) allows the flexible securing material 30 to be approximately flush with a bottom surface of the electronics module base 12. In particular, a segment of the flexible securing material 30 that extends under the base 12 directly under each fan is preferably received within the recess defined by the projection 16 on the underside of the base 12. The recess defined by the projection 16 on the underside of the base 12 is preferably at least approximately equal in height to the thickness of the flexible securing material 30. Such a configuration of the recess on the underside of the base 12 thus ensures that the segment of the flexible securing material 30 does not extend or protrude below the bottom surface of the base 12 and is thus generally flush with the bottom surface of the base 12. Without the projection 16, the segment of the flexible securing material 30 may protrude beyond the bottom surface of the base 12 and thus may catch on the baffle or other component of the electronics module below, particular when either electronics module is accessed, e.g., slid in or out of the rack cabinet.

The flexible securing material 30 is preferably a two-sided hook and loop material, e.g., the hook material is provided on one side while the loop material is provided on the other opposite side such that one end segment of the hook and loop material 30 may be secured onto itself on its opposite side to form a closed loop. As an example, the entire length of each side of the hook and loop material 30 may provide the corresponding hook material and loop material. As another example, only one side of the hook and loop material 30 may provide the hook (or loop) material on its entire length while the other side only provides the loop (or hook) material on an end segment such that the end loop segment can be wrapped around and attached to a corresponding section on the hook (or loop) side and thus form a closed loop, preferably with the hook (loop) material covering the entire outside surface of the closed loop.

The lower bracket 22 and the upper bracket 26 are configured such that the device cooling fans may be disposed therebetween in a generally upright or vertical position relative to the electronics module base 12. The baffle portion 24 extending between the lower and upper brackets 22, 26 defines airflow openings 32 corresponding to the locations of the fans to allow air to pass therethrough while generally enclosing the remaining areas between the desired airflow regions so as to better direct airflow. The enclosed areas of the baffle portion 24 help to direct the cooling air past the electronics modules to be cooled and prevents the air from simply circulating locally from the high to the low pressure side of the fan.

Figure 3:
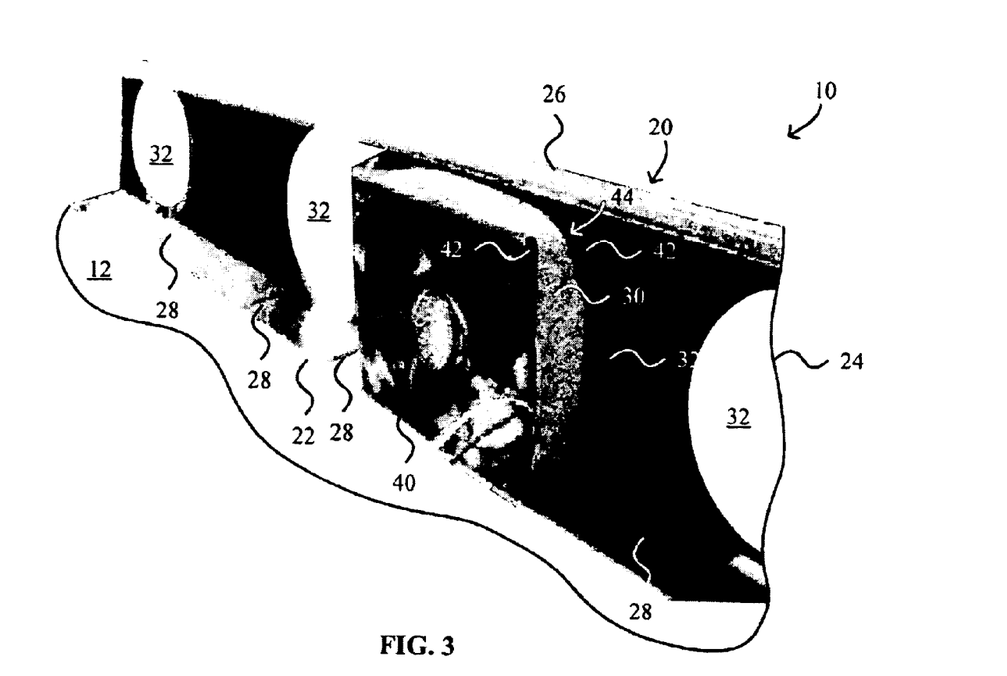
FIG. 3 is a partial perspective view illustrating a fan mounted in the fan mount baffle which is in turn mounted to the electronics module base of the electronics module via the hook and loop material.

FIG. 3 is a partial perspective view illustrating a fan 40 positioned in the fan mount baffle 20 which is in turn positioned on the electronics module base 12 of the electronics module 10. The flexible securing material 30 secures the fan 40 to the electronics module base 12 and, with the lower bracket 22 of the fan mount baffle 20 disposed between the fan 40 and the electronics module base 12, the fan 40 in turns secures the fan mount baffle 20 to the electronics module base 12.

Although one fan 40 is shown for purposes of clarity, a typical application may have any suitable number of fans. In the embodiments shown and described herein, the fan mount baffle 20 is configured for four fans 40. Each fan includes front and back plates 42 such that recessed areas 44 may be defined between the front and back plates 42 at each of the four corners for receiving the hook and loop material 30 therein. In particular, as shown, the fan 40 is positioned on the lower bracket 22 of the fan mount baffle 20 so as to generally coincide with the corresponding airflow opening 32. The fan 40 is then secured to the electronics module base 12 using the same hook and loop material 30 that extends through the openings provided in the electronics module base 12 and the fan mount baffle 20. The hook and loop material 30 preferably wraps around the fan 40 within the recessed area 44 so that, because the lower bracket 28 of the fan mount baffle 20 is between the fan 40 and the electronics module base 12, the fan 40 in turns secures the fan mount baffle 20 to the electronics module base 12. The hook and loop material 30 may be wrapped fully around the fan 40 such that one end of the material 30 is secured to the other side of another section of the hook and loop material 30 within the recessed area 44 of the fan 40.

Figure 4:
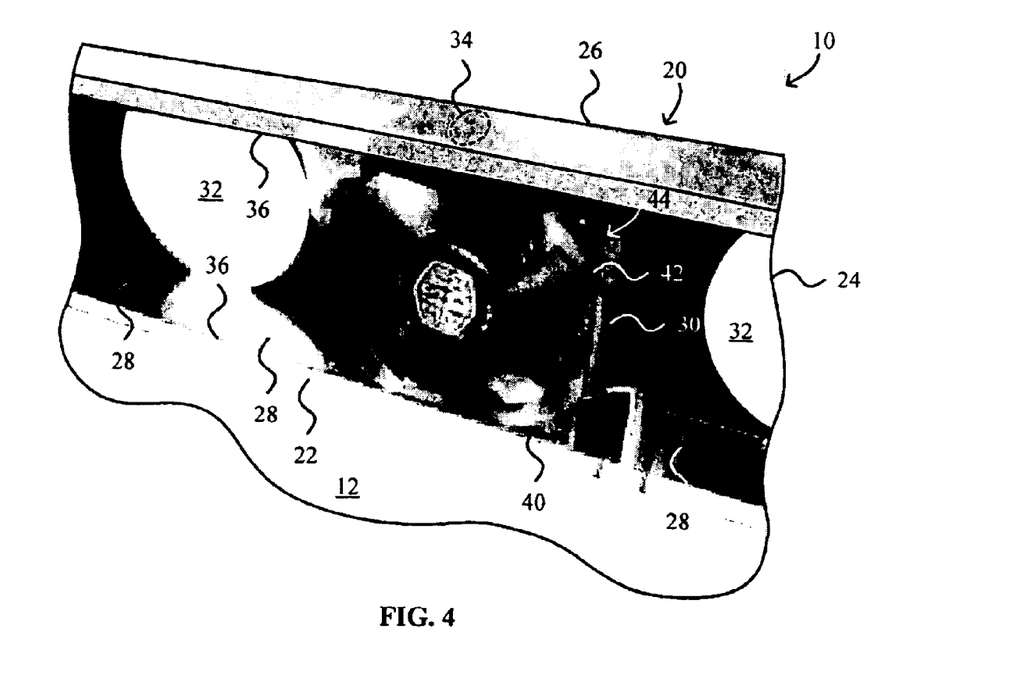
FIG. 4 is a partial perspective view illustrating the fan fully mounted in the fan mount baffle on the electronics module base.

FIG. 4 is a partial perspective view illustrating the fan 40 fully mounted within the fan mount baffle 20 on the electronics module base 12. As shown, the fan 40 is disposed between the lower and the upper brackets 22, 26 such that a section of the hook and loop material 30 wrapped around the fan is in contact with another corresponding hook and loop material 34 (shown in phantom) disposed on an underside of the upper bracket 26. The hook and loop material 34 may be round, square or any other suitable shape, e.g., in the form of a Velcro tab, and may be attached to the underside of the upper bracket 26 via an adhesive, such as an adhesive backing provided on the hook and loop tab 34. The hook and loop tab 34 may be a hook material where the hook and loop material 30 is configured such that a loop material is facing the tab 34. Alternatively, the hook and loop tab 34 may be a loop material where the hook and loop material 30 is configured such that a hook material is facing the tab 34.

As is evident, the lower bracket 22 is secured to the electronics module base 12 and the upper bracket 26 is secured to the fan which is in turn secured to the electronics module base 12 via the hook and loop materials 30, 34, respectively. The lower and upper brackets 22, 26 may provide lips or extensions 36 that project toward each other. In general, the fan mount baffle 20 may be made of any suitable material but is preferably slightly flexible or bendable to facilitate the positioning and securing of the fans 40 between the lower and upper brackets 22, 26 of the fan mount baffle 20, particularly with the provision of the lips 36.

Any other suitable mechanism may be provided to secure the upper bracket 26 to the fan 40. For example, the upper bracket 26 of the fan mount baffle 20 may provide openings similar to the mounting openings 28 defined by the lower bracket 22. In such a configuration, the openings in the upper bracket 26 may allow the piece of hook and loop material 30 provided for each fan to extend through the upper bracket 26 and form a closed loop over a corresponding portion of the upper bracket 26. The hook and loop material 30 thus exerts pressure on and thus pushes the upper bracket 26 toward the fan 40. A separate hook and loop material may be attached to a top portion of the fan 40 so as to cooperate with the hook and loop tab 34 on the underside of the upper bracket 26.

As another example, the baffle portion 24 is shown and described to be provided on only one side of the fans 40. However, the fan mount baffle 20 may be modified to be without the upper bracket 26 and with the baffle portion 24 provided on both sides of the fans such that the fans 40 can be dropped into the modified fan mount baffle and secured with only the hook and loop strap 30, i.e., without the hook and loop tab 34.

The fan mount baffle 20 facilitates fast, easy and convenient installation and/or removal of the fans from the electronics module 10 for maintenance and/or servicing by a service technician. With the use of the hook and loop material, the fans can be quickly removed and reinstalled by the service technician without the use of tools.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A fan mounting baffle apparatus for cooling electronics components, comprising:

an upper bracket;

a lower bracket defining a plurality of bracket mounting openings to cooperate with base mounting openings defined in a mounting base to which electronics components are attached, the bracket mounting openings being configured for a flexible securing material to extend through the bracket mounting openings from the base mounting openings, the upper and lower brackets being configured to receive at least one fan therebetween; and a baffle portion extending between the upper bracket and the lower bracket and defining at least one fan opening to cooperate with the fan for airflow to pass through the baffle portion via the opening.

2. The apparatus of claim 1, further comprising the flexible securing material configured to extend through the base mounting openings of the mounting base and the bracket mounting openings of the lower bracket to secure the lower bracket to the mounting base.

3. The apparatus of claim 1, wherein the flexible securing material is further configured to secure the fan to the mounting base.

4. The apparatus of claim 1, wherein the flexible securing material is a first hook and loop material.

5. The apparatus of claim 4, further comprising a second hook and loop material secured to an underside of the upper bracket, the second hook and loop material being configured to cooperate with the first hook and loop material to secure the upper bracket to the fan.

6. The apparatus of claim 1, wherein the upper bracket includes a lip extending toward the lower bracket.

7. The apparatus of claim 1, wherein the lower bracket includes a lip extending toward the upper bracket.

8. The apparatus of claim 1, wherein the lower bracket defines an indentation on an underside of the lower bracket, the indentation being configured to cooperate with a projection defined in the mounting base.

9. The apparatus of claim 1, further comprising the fan secured between the upper and lower brackets, the fan having two plates and a recessed region between the two plates, the recessed region being configured to receive the flexible securing material therein.

10. The apparatus of claim 1, wherein the flexible securing material is configured to wrap around the fan and to be secured to itself so as to secure the fan between the upper and lower brackets.

11. An electronics components cooling system, comprising:
   a plurality of fans;
   a baffle for mounting the fans therein, the baffle comprising an upper bracket, a lower bracket and a baffle portion extending between the upper and lower brackets, the upper and lower brackets being configured to receive the fans therebetween, the baffle portion defining a plurality of fan openings each corresponding to and to cooperate with one of the plurality of fans for airflow to pass through the baffle portion via the fan opening, the baffle being configured to be secured to a mounting base to which electronics components are attached; and
   a flexible securing material for each of the plurality of fans, each flexible securing material being configured to wrap around a perimeter of the fan to secure the corresponding fan to the mounting base.

12. The cooling system of claim 11, wherein the lower bracket defines a plurality of bracket mounting openings to cooperate with base mounting openings defined in the mounting base, the openings being configured for the flexible securing material to extend through the bracket mounting openings from the base mounting openings.

13. The cooling system of claim 12, wherein the flexible securing material is configured to extend through the base mounting openings of the mounting base and the bracket mounting openings of the lower bracket to secure the lower bracket to the mounting base.

14. The cooling system of claim 11, wherein the flexible securing material is a first hook and loop material.

15. The cooling system of claim 14, further comprising a second hook and loop material secured to an underside of the upper bracket, the second hook and loop material being configured to cooperate with the first hook and loop material to secure the upper bracket to the fan.

16. The cooling system of claim 11, wherein the upper bracket includes a lip extending toward the lower bracket.

17. The cooling system of claim 11, wherein the lower bracket includes a lip extending toward the upper bracket.

18. The cooling system of claim 11, wherein the lower bracket defines an indentation on an underside of the lower bracket, the indentation being configured to cooperate with a projection defined in the mounting base.

19. The cooling system of claim 11, wherein the fan has two plates and a recessed region between the two plates, the recessed region being configured to receive the flexible securing material therein.

20. The cooling system of claim 11, wherein the flexible securing material is configured to wrap around the fan and to be secured to itself so as to secure the fan between the upper and lower brackets.

* * * * *

UNITED STATES PATENT AND TRADEMARK OFFICE
CERTIFICATE OF CORRECTION

PATENT NO.        : 6,845,009 B1
APPLICATION NO.   : 10/676840
DATED             : January 18, 2005
INVENTOR(S)       : William H. Whitted It is certified that error appears in the above-identified patent and that said Letters Patent is hereby corrected as shown below:

On the cover page, replace the figure with the following figure:

UNITED STATES PATENT AND TRADEMARK OFFICE
CERTIFICATE OF CORRECTION

PATENT NO. : 6,845,009 B1  Page 2 of 7
APPLICATION NO. : 10/676840
DATED : January 18, 2005
INVENTOR(S) : William H. Whitted It is certified that error appears in the above-identified patent and that said Letters Patent is hereby corrected as shown below:

On drawing sheet 1, replace FIG. 2 with the following FIG. 2:

FIG. 2

UNITED STATES PATENT AND TRADEMARK OFFICE
CERTIFICATE OF CORRECTION

PATENT NO. : 6,845,009 B1  Page 3 of 7
APPLICATION NO. : 10/676840
DATED : January 18, 2005
INVENTOR(S) : William H. Whitted It is certified that error appears in the above-identified patent and that said Letters Patent is hereby corrected as shown below:

On drawing sheet 2, replace FIG. 3 with the following FIG. 3:

FIG. 3

UNITED STATES PATENT AND TRADEMARK OFFICE
CERTIFICATE OF CORRECTION

PATENT NO. : 6,845,009 B1
APPLICATION NO. : 10/676840
DATED : January 18, 2005
INVENTOR(S) : William H. Whitted It is certified that error appears in the above-identified patent and that said Letters Patent is hereby corrected as shown below:

On drawing sheet 2, replace FIG. 4 with the following FIG. 4:

FIG. 4

Signed and Sealed this

Seventh Day of November, 2006

JON W. DUDAS
*Director of the United States Patent and Trademark Office*

(12) United States Patent
Whitted (10) Patent No.: US 6,845,009 B1
(45) Date of Patent: Jan. 18, 2005

(54) COOLING BAFFLE AND FAN MOUNT APPARATUS

(75) Inventor: William H. Whitted, Palo Alto, CA (US)

(73) Assignee: Google Inc., Mountain View, CA (US)

(*) Notice: Subject to any disclaimer, the term of this patent is extended or adjusted under 35 U.S.C. 154(b) by 0 days.

(21) Appl. No.: 10/676,840

(22) Filed: Sep. 30, 2003

(51) Int. Cl.$^7$ .................................. H05K 7/20
(52) U.S. Cl. .................. 361/695; 361/690; 361/719; 174/16.1; 454/184
(58) Field of Search ................... 361/683–688, 361/690, 694, 695, 715–721; 174/16.1, 16.3; 165/80.2, 80.3; 454/184

(56) References Cited

U.S. PATENT DOCUMENTS

| | | | |
|---|---|---|---|
| 6,031,717 A | * | 2/2000 | Baddour et al. ............ 361/687 |
| 6,317,320 B1 | * | 11/2001 | Cosley et al. ............. 361/695 |
| 6,478,284 B2 | * | 11/2002 | Qiu .......................... 248/680 |
| 6,504,718 B2 | * | 1/2003 | Wu ........................... 361/395 |
| 6,592,449 B2 | * | 7/2003 | Cipolla et al. ............. 454/184 |
| 6,700,778 B1 | * | 3/2004 | Wang ......................... 361/690 |
| 6,785,145 B1 | * | 8/2004 | Wong ......................... 361/752 |
| 2004/0162018 A1 | * | 8/2004 | Lee et al. ................... 454/184 |

* cited by examiner

*Primary Examiner*—Boris Chervinsky
(74) *Attorney, Agent, or Firm*—Jung-hua Kuo (57) ABSTRACT

A cooling baffle and fan mount apparatus suitable for rack mount computing systems is disclosed. The apparatus generally includes an upper and lower bracket configured to receive fans therebetween, the lower bracket defining mounting openings to cooperate with base openings defined in an electronics components base, and a baffle portion extending between the upper and lower brackets and defining fan openings to cooperate with the fans for airflow to pass through the baffle portion via the openings. The mounting openings may be configured for a flexible securing material, e.g., a hook and loop material, to extend therethrough from the base openings. A hook and loop tab may be secured to an underside of the upper bracket to cooperate with the hook and loop material to further secure the baffle. Each fan may provide a recessed region between two plates to receive the hook and loop material and to allow the hook and loop material to be wrapped around the fan and secured to itself.

20 Claims, 2 Drawing Sheets